(12) United States Patent
Park (10) Patent No.: US 11,231,545 B2
(45) Date of Patent: *Jan. 25, 2022

(54) DISPLAY DEVICE

(71) Applicant: Samsung Display Co., Ltd., Yongin-si (KR)

(72) Inventor: Jinhyuk Park, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 17/129,560

(22) Filed: Dec. 21, 2020

(65) Prior Publication Data

US 2021/0109276 A1    Apr. 15, 2021

Related U.S. Application Data

(63) Continuation of application No. 16/579,593, filed on Sep. 23, 2019, now Pat. No. 10,877,206.

(30) Foreign Application Priority Data

Oct. 12, 2018    (KR) .......................... 10-2018-0121599

(51) Int. Cl.
*F21V 8/00* (2006.01)
*H05K 7/20* (2006.01)
*F28F 21/08* (2006.01)

(52) U.S. Cl.
CPC .......... *G02B 6/0085* (2013.01); *F28F 21/083* (2013.01); *F28F 21/084* (2013.01);
(Continued)

(58) Field of Classification Search
CPC ................ G02B 6/0085; G02B 6/0083; H05K 7/20963; F28F 21/087; F28F 21/084;
(Continued)

(56) References Cited

U.S. PATENT DOCUMENTS 7,452,121 B2    11/2008    Cho et al.
7,629,748 B2    12/2009    Kim
(Continued)

FOREIGN PATENT DOCUMENTS

JP    2015-210855 A    11/2015
KR    10-0669711 B1    1/2007
(Continued)

*Primary Examiner* — Tsion Tumebo
(74) *Attorney, Agent, or Firm* — Lewis Roca Rothgerber Christie LLP (57) ABSTRACT

A display device is capable of substantially reducing or preventing warping or deformation thereof by using a bimetallic effect. The display device includes a backlight unit including at least one light source; a light source circuit board at which the light source is disposed; a first heat dissipation plate configured to receive heat generated from the light source through the light source circuit board, and to discharge the heat; a bottom case configured to accommodate the light source, the light source circuit board, and the first heat dissipation plate; and a second heat dissipation plate configured to resist a deformation force that is applied to the first heat dissipation plate or the bottom case, the second heat dissipation plate has a thermal expansion coefficient different from a thermal expansion coefficient of the first heat dissipation plate.

24 Claims, 5 Drawing Sheets

* 850 : 777a, 777b, 777c, 778a, 778b, 778c
* 400 : 411a, 411b, 411c
* 500 : 533a, 533b (52) U.S. Cl.
CPC .......... *F28F 21/085* (2013.01); *F28F 21/087* (2013.01); *G02B 6/0083* (2013.01); *H05K 7/20963* (2013.01)

(58) Field of Classification Search
CPC . F28F 21/085; F28F 21/083; G02F 1/133385; G02F 1/133628; G02F 1/133308; G02F 1/133382; G02F 1/1336; G02F 1/133314
See application file for complete search history.

(56) References Cited

U.S. PATENT DOCUMENTS

| | | |
|---|---|---|
| 8,550,665 B2 | 10/2013 | Yu et al. |
| 8,558,971 B2 | 10/2013 | Li |
| 8,608,346 B2 | 12/2013 | Wang et al. |
| 8,845,139 B2 | 9/2014 | Shin et al. |
| 9,140,849 B2 | 9/2015 | Choi et al. |
| 9,268,084 B2 | 2/2016 | Bae et al. |
| 9,447,958 B2 | 9/2016 | Lee |
| 9,488,772 B2 | 11/2016 | Momose et al. |
| 9,609,774 B2 | 3/2017 | Paek et al. |
| 10,120,224 B2 | 11/2018 | Lee et al. |
| 2009/0096957 A1 | 4/2009 | Hiyama et al. |
| 2009/0316064 A1 | 12/2009 | Kono et al. |
| 2013/0016524 A1 | 1/2013 | Momose et al. |
| 2015/0098026 A1 | 4/2015 | Kasai |
| 2017/0131462 A1 | 5/2017 | Meng |

FOREIGN PATENT DOCUMENTS

| | | |
|---|---|---|
| KR | 10-1214945 B1 | 12/2012 |
| KR | 10-2015-0071437 A | 6/2015 |
| KR | 10-2017-0079331 A | 7/2017 |

DISPLAY DEVICE

CROSS-REFERENCE TO RELATED APPLICATIONS

This application is a continuation of U.S. patent application Ser. No. 16/579,593, filed Sep. 23, 2019, which claims priority to and the benefit of Korean Patent Application No. 10-2018-0121599, filed Oct. 12, 2018, the entire content of both of which is incorporated herein by reference.

BACKGROUND

1. Field

Embodiments of the present invention relate to a display device, and more particularly, to a display device capable of substantially reducing or preventing warping or deformation.

2. Description of the Related Art

Display devices may be classified into liquid crystal display ("LCD") devices, organic light emitting diode ("OLED") display devices, plasma display panel ("PDP") display devices, or electrophoretic display devices based on a light emitting scheme thereof.

LCD devices are a light-receiving type display device that includes a display panel and a backlight unit ("BLU") for supplying light to the display panel. An LCD device includes two substrates opposing each other, electrodes formed on the substrates, and a liquid crystal layer interposed therebetween. Upon applying voltage to the electrodes, liquid crystal molecules of the liquid crystal layer are rearranged, and thus an amount of transmitted light is controlled in the LCD device.

The backlight units may be classified into direct-type backlight units, edge-type backlight units or corner-type backlight units according to the position of light sources. In the direct-type backlight unit, a plurality of light sources are disposed below a display panel, and a light emitted from the light source is incident to the display panel through a diffusion plate. The edge-type backlight unit includes a light guide plate and a light source disposed on one side of the light guide plate, and a light emitted from the light source passes through the light guide plate to be incident to the display panel.

As the light source used in the backlight unit, there is a point light source such as a light emitting diode ("LED"). In the LED, about 70 to 80% of an input power is converted into heat energy. The display device may be warped or deformed due to such heat energy, and in the case of a curved display, a curvature of the curved display device may be reduced.

It is to be understood that this background of the technology section is intended to provide useful background for understanding the technology and as such disclosed herein, the technology background section may include ideas, concepts or recognitions that were not part of what was known or appreciated by those skilled in the pertinent art prior to a corresponding effective filing date of subject matter disclosed herein.

SUMMARY

Aspects of embodiments of the present invention are directed toward a display device capable of substantially reducing or preventing warping or deformation thereof by using a bimetallic effect.

According to an embodiment, a backlight unit includes: at least one light source; a light source circuit board at which the light source is disposed; a first heat dissipation plate configured to receive a heat generated from the light source through the light source circuit board, and to discharge the heat; a bottom case configured to accommodate the light source, the light source circuit board, and the first heat dissipation plate; and a second heat dissipation plate configured to resist a deformation force that is applied to the first heat dissipation plate or the bottom case. The second heat dissipation plate has a thermal expansion coefficient different from a thermal expansion coefficient of the first heat dissipation plate.

The first heat dissipation plate may include at least one selected from aluminum, aluminum alloy, and stainless steel.

The second heat dissipation plate may include at least one selected from zinc, tin and lead.

The second heat dissipation plate may include at least one selected from chromium, iron, nickel, and copper.

The second heat dissipation plate may be under the first heat dissipation plate.

The second heat dissipation plate may have a thermal expansion coefficient higher than the thermal expansion coefficient of the first heat dissipation plate.

The second heat dissipation plate may have a thermal expansion coefficient lower than the thermal expansion coefficient of the first heat dissipation plate.

The second heat dissipation plate may be over the first heat dissipation plate.

The backlight unit may further include a third heat dissipation plate disposed under the first heat dissipation plate.

The second heat dissipation plate may have a thermal expansion coefficient lower than the thermal expansion coefficient of the first heat dissipation plate.

The second heat dissipation plate may have a thermal expansion coefficient higher than the thermal expansion coefficient of the first heat dissipation plate.

The thermal expansion coefficient of the second heat dissipation plate may be based on a deformation direction of the first heat dissipation plate or the bottom case.

The second heat dissipation plate may be joined to the first heat dissipation plate or the bottom case by brazing.

According to an embodiment, a display device includes: a display panel configured to display images; at least one light source configured to provide light to the display panel; a light source circuit board at which the light source is disposed; a first heat dissipation plate configured to receive a heat generated from the light source through the light source circuit board, and to discharge the heat; a bottom case configured to accommodate the light source, the light source circuit board, and the first heat dissipation plate; and a second heat dissipation plate configured to resist a deformation force that is applied to the first heat dissipation plate or the bottom case. The second heat dissipation plate has a thermal expansion coefficient different from a thermal expansion coefficient of the first heat dissipation plate.

The first heat dissipation plate may include at least one selected from aluminum, aluminum alloy, and stainless steel.

The second heat dissipation plate may include at least one selected from zinc, tin and lead.

The second heat dissipation plate may include at least one selected from chromium, iron, nickel, and copper.

The first heat dissipation plate may be between the display panel and the second heat dissipation plate.

The second heat dissipation plate may have a thermal expansion coefficient higher than the thermal expansion coefficient of the first heat dissipation plate.

The second heat dissipation plate may have a thermal expansion coefficient lower than the thermal expansion coefficient of the first heat dissipation plate.

The second heat dissipation plate may be between the display panel and the first heat dissipation plate.

The display device may further include a third heat dissipation plate under the first heat dissipation plate.

The second heat dissipation plate may have a thermal expansion coefficient lower than the thermal expansion coefficient of the first heat dissipation plate.

The second heat dissipation plate may have a thermal expansion coefficient higher than the thermal expansion coefficient of the first heat dissipation plate.

The thermal expansion coefficient of the second heat dissipation plate may be based on a deformation direction of the first heat dissipation plate or the bottom case.

The second heat dissipation plate may be joined to the first heat dissipation plate or the bottom case by brazing.

The display panel may have a curved surface.

The second heat dissipation plate may have a thermal expansion coefficient higher than the thermal expansion coefficient of the first heat dissipation plate.

The foregoing is illustrative only and is not intended to be in any way limiting. In addition to the illustrative aspects, embodiments and features described above, further aspects, embodiments and features will become apparent by reference to the drawings and the following detailed description.

BRIEF DESCRIPTION OF THE DRAWINGS

A more complete appreciation of aspects of the present invention will become more apparent by describing in more detail embodiments thereof with reference to the accompanying drawings.

DETAILED DESCRIPTION

Embodiments will now be described more fully hereinafter with reference to the accompanying drawings. Although the invention may be modified in various manners and have several embodiments, embodiments are illustrated in the accompanying drawings and will be mainly described in the specification. However, the scope of the present invention is not limited to the embodiments and should be construed as including all the changes, equivalents and substitutions included in the spirit and scope of the present invention.

In the drawings, thicknesses of a plurality of layers and areas are illustrated in an enlarged manner for clarity and ease of description thereof. When a layer, area, or plate is referred to as being "on" or "adjacent to" another layer, area, or plate, it may be directly on the other layer, area, or plate, or intervening layers, areas, or plates may be present therebetween. Conversely, when a layer, area, or plate is referred to as being "directly on" or "immediately adjacent to" another layer, area, or plate, intervening layers, areas, or plates may be absent therebetween. Further when a layer, area, or plate is referred to as being "below" another layer, area, or plate, it may be directly below the other layer, area, or plate, or intervening layers, areas, or plates may be present therebetween. Conversely, when a layer, area, or plate is referred to as being "directly below" another layer, area, or plate, intervening layers, areas, or plates may be absent therebetween.

The spatially relative terms "below", "beneath", "lower", "above", "upper" and the like, may be used herein for ease of description to describe the relations between one element or component and another element or component as illustrated in the drawings. It will be understood that the spatially relative terms are intended to encompass different orientations of the device in use or operation, in addition to the orientation illustrated in the drawings. For example, in a case where a device illustrated in the drawing is turned over, the device positioned "below" or "beneath" another device may be placed "above" another device. Accordingly, the illustrative term "below" may include both the lower and upper positions. The device may also be oriented in the other direction and thus the spatially relative terms may be interpreted differently depending on the orientations.

Throughout the specification, when an element is referred to as being "connected" to another element, the element is "directly connected" to the other element, or "electrically connected" to the other element with one or more intervening elements interposed therebetween.

The terminology used herein is for the purpose of describing particular embodiments only and is not intended to be limiting of the present disclosure. As used herein, the singular forms "a" and "an" are intended to include the plural forms as well, unless the context clearly indicates otherwise. It will be further understood that the terms "comprises," "comprising," "includes" and/or "including," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list.

It will be understood that, although the terms "first," "second," "third," and the like may be used herein to describe various elements, these elements should not be limited by these terms. These terms are only used to distinguish one element from another element. Thus, "a first element" discussed below could be termed "a second element" or "a third element," and "a second element" and "a third element" may be termed likewise without departing from the spirit and scope of the present disclosure.

"About," "substantially," "approximately," and similar terms as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value. Further, the use of "may" when describing embodiments of the present disclosure refers to "one or more embodiments of the present disclosure." As used herein, the terms "use," "using," and "used" may be considered synonymous with the terms "utilize," "utilizing," and "utilized," respectively.

The electronic or electric devices and/or any other relevant devices or components according to embodiments of the present disclosure described herein, such as, for example, an external controller, a timing controller, a data driver, a scan driver, a grayscale voltage generator, a grayscale corrector, and an emission driver, may be implemented utilizing any suitable hardware, firmware (e.g. an application-specific integrated circuit), software, or a combination of software, firmware, and hardware known to those of ordinary skill in the art. For example, the various components of these devices may be formed on one integrated circuit (IC) chip or on separate IC chips. Further, the various components of these devices may be implemented on a flexible printed circuit film, a tape carrier package (TCP), a printed circuit board (PCB), or formed on one substrate. Further, the various components of these devices may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of ordinary skill in the art should recognize that the functionality of various computing/electronic devices may be combined or integrated into a single computing/electronic device, or the functionality of a particular computing/electronic device may be distributed across one or more other computing/electronic devices without departing from the spirit and scope of the present disclosure.

Unless otherwise defined, all terms used herein (including technical and scientific terms) have the same meaning as commonly understood by those skilled in the art to which this invention pertains. It will be further understood that terms, such as those defined in commonly used dictionaries, should be interpreted as having a meaning that is consistent with their meaning in the context of the relevant art and will not be interpreted in an ideal or excessively formal sense unless clearly defined at the present specification.

Some of the parts which are not associated with the description may not be provided in order to specifically describe embodiments of the present invention and like reference numerals refer to like elements throughout the specification.

Hereinafter, a display device according to an embodiment will be described in detail with reference to FIGS. 1-7. Meanwhile, the component names used in the following description are selected in consideration of ease of specification, and may be different from actual product names.

Figure 1:
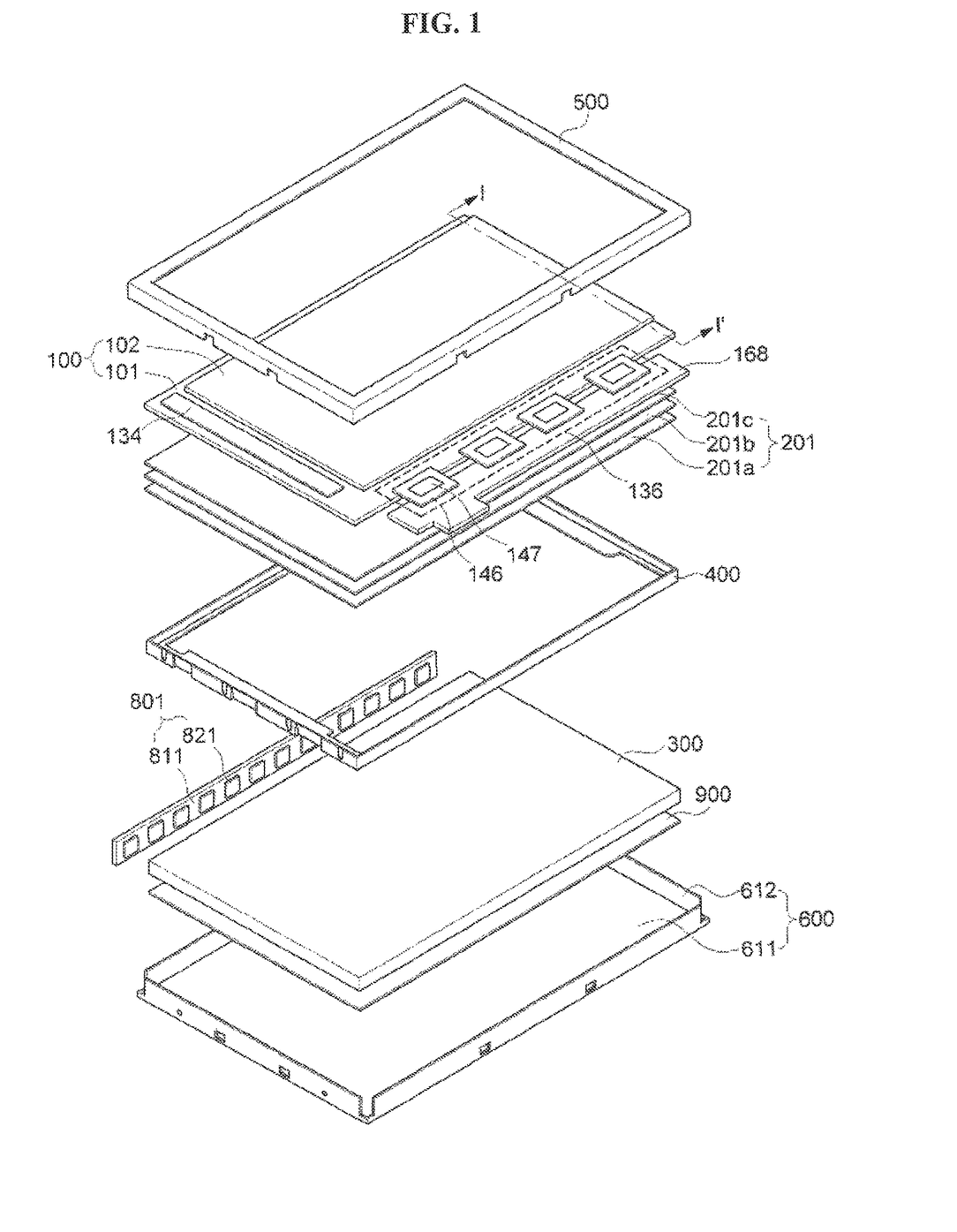
FIG. 1 is an exploded perspective view illustrating a display device according to an embodiment.
Figure 2:
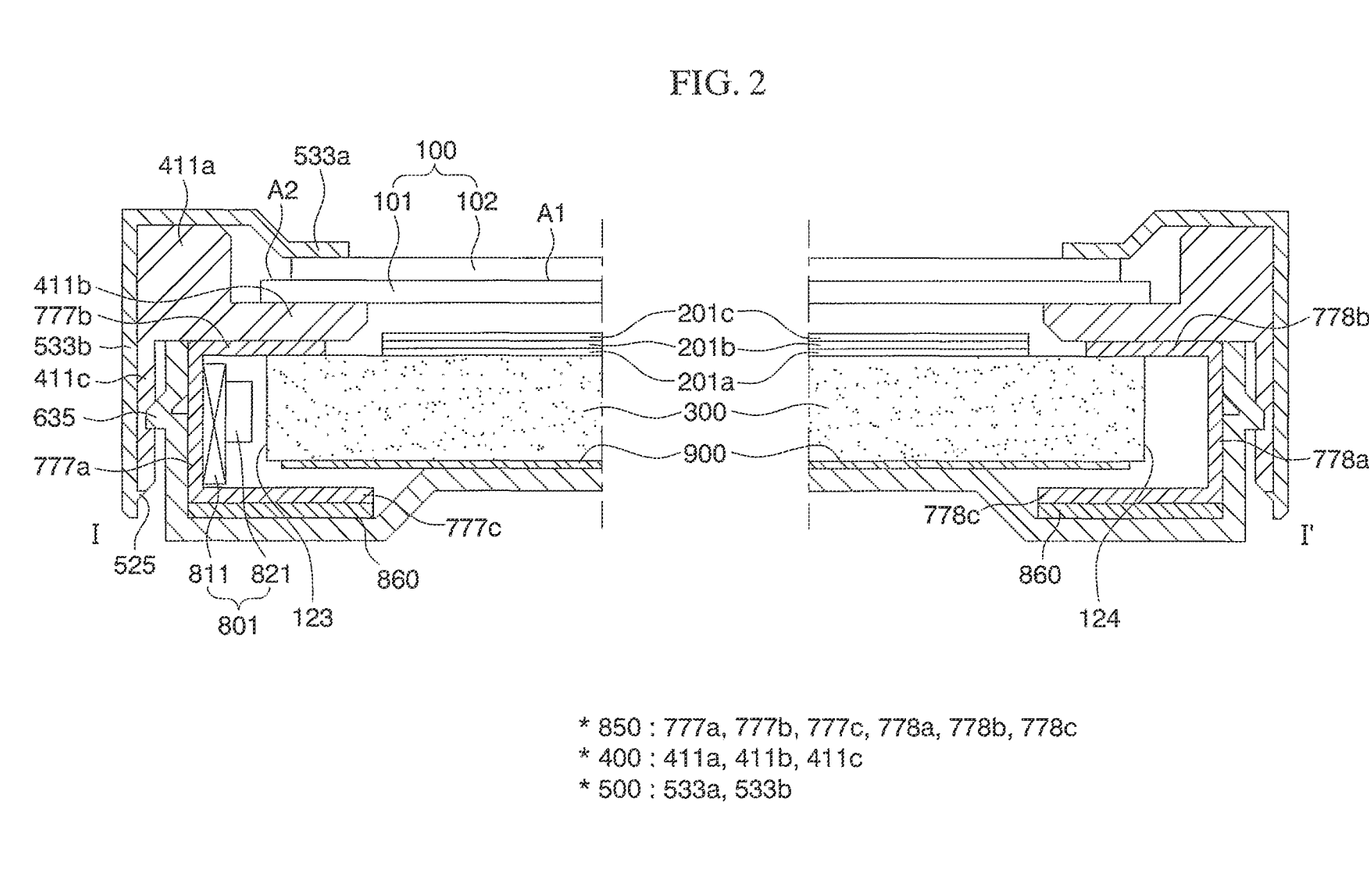
FIG. 2 is a cross-sectional view taken along line I-I' in FIG. 1.

FIG. 1 is an exploded perspective view illustrating a display device according to an embodiment, and FIG. 2 is a cross-sectional view taken along line I-I' in FIG. 1.

As illustrated in FIGS. 1-2, a display device according to an embodiment includes a bottom case 600, a reflection plate 900, a light guide plate (LGP) 300, an optical sheet 201, a light source unit 801, a first heat dissipation plate 850, a second heat dissipation plate 860, a mold frame 400, a display panel 100, a gate driver 134, a data driver 136, and a top case 500.

Herein, the reflection plate 900, the light guide plate 300, the optical sheet 201, the light source unit 801, the first and second heat dissipation plates 850 and 860, the mold frame 400, and the bottom case 600 may be included in a backlight unit. In such an embodiment, the display panel 100 and the backlight unit may be assembled in a laminated state to constitute a display device. The display device may further include a top case 500 for protecting and securing the display panel 100 and the backlight unit, and a driving circuit board for driving the display panel 100.

The bottom case 600 may have an accommodation space therein. The reflection plate 900, the light guide plate 300, the optical sheet 201, the light source unit 801, the first and second heat dissipation plates 850 and 860 may be in the accommodation space. In order to secure the accommodation space, the bottom case 600 may include a base portion 611 and a plurality of side portions 612. For example, the base portion 611 may have a quadrangular shape, and the side portions 612 may protrude from respective edge portions of the base portion 611 to have a set or predetermined height. Edges of the side portions 612 that are adjacent to each other may be connected to each other. A space defined by the side portions 612 and the base portion 611 may correspond to the aforementioned accommodation space. In an embodiment, a locking projection 635 may be on an outer side of the side portions 612 that face each other, and the mold frame 400 may be secured to the bottom case 600 by the locking projection 635. A part of the side portions 612 may protrude toward the mold frame 400, thereby forming the locking projection 635.

The bottom case 600 may accommodate a light source 821, a light source circuit board 811, the first heat dissipation plate 850, and the second heat dissipation plate 860.

The light source unit 801 may generate light. A light generated in the light source unit 801 may be provided to the display panel 100 through the light guide plate 300 and the optical sheet 201. Although it is depicted in FIGS. 1-2 that the light source unit 801 is at a lower portion of the display device, the light source unit 801 may be additionally at an upper portion of the display device.

The gate driver 134 may generate gate signals according to a gate control signal applied from a timing controller, and may sequentially apply the gate signals to the plurality of gate lines.

The data driver 136 may include a plurality of data driving integrated circuits ("ICs") 147. The data driving ICs 147 may receive digital image data signals and a data control signal applied thereto from the timing controller. The data driving ICs 147 may sample the digital image data signals according to the data control signal, may latch the sampled image data signals corresponding to one horizontal line every horizontal period, and may apply the latched image data signals to data lines. That is, the data driving ICs 147 may convert the digital image data signals applied from the timing controller into analog image signals using a gamma voltage applied from a power supplier, and may apply the analog image signals to the data lines.

Respective ones of the data driving ICs 147 may be mounted on carriers 146. The carriers 146 may be connected between a printed circuit board ("PCB") 168 and the display panel 100. The timing controller and the power supplier described above may be located at the PCB 168. Also, the carrier 146 may include: input wirings configured to provide or transmit various signals applied thereto from the timing controller and the power supplier to the data driving IC 147; and output wirings configured to provide or transmit the image data signals output from the data driving IC 147 to corresponding ones of the data lines.

The light guide plate 300 may guide the light provided from the light source unit 801 to the display panel 100. The light guide plate 300 may be positioned toward the light source unit 801. One surface of a plurality of surfaces included in the light guide plate 300 that faces the light source 821 may be defined as a light incidence surface 123.

The light emitted from the light source 821 may be incident to the light incidence surface 123 and then proceeds to the inside of the light guide plate 300. The light guide plate 300 may totally reflect the light that has entered the light guide plate 300, and may guides the light toward a display area of the display panel 100.

In some embodiments, a plurality of scattering patterns may be further provided on a lower outer surface of the light guide plate 300 in order to improve a reflectance of the light guide plate 300.

The light guide plate 300 may include a material having transmittance, e.g., an acrylic resin (such as polymethyl methacrylate (PMMA)) and/or polycarbonate (PC), to guide light efficiently.

The reflection plate 900 may be positioned between the light guide plate 300 and the base portion 611 of the bottom case 600. The reflection plate 900 may reflect the light passing through a lower surface of the light guide plate 300 to the outside to guide the light back toward the light guide plate 300, thereby substantially reducing or minimizing a light loss rate.

The optical sheet 201 may diffuse and collimate the light directed thereto from the light guide plate 300. The optical sheet 201 may be positioned between the light guide plate 300 and the display panel 100. The optical sheet 201 may include a diffusion sheet 201a, a collimation sheet 201b, and a protection sheet 201c. The diffusion sheet 201a, the collimation sheet 201b, and the protection sheet 201c may be stacked on the light guide plate 300 in this order.

The diffusion sheet 201a may serve to diffuse the light guided from the light guide plate 300 so as to substantially reduce the chance of the light being partially concentrated or even prevent the light from being partially concentrated.

The collimation sheet 201b may be disposed on the diffusion sheet 201a. The collimation sheet 201b may serve to collimate the light diffused by the diffusion sheet 201a in a direction normal (e.g., perpendicular) to the display panel 100. To this end, prisms each, having a triangular cross-section, may be in a set or predetermined arrangement on a surface of the collimation sheet 201b.

The protection sheet 201c may be on the collimation sheet 201b. The protection sheet 201c may serve to protect a surface of the collimation sheet 201b and diffuse light to achieve uniform light distribution. The light transmitted through the protection sheet 201c may be directed to the display panel 100.

The first heat dissipation plate 850 may surround one side of the light guide plate 300 so that the light source unit 801 and the light incident surface 123 of the light guide plate 300 may be included in a space defined by the first heat dissipation plate 850. The first heat dissipation plate 850 may align the light sources 821 with the light incidence surface 123 so that the light provided from the light sources 821 may be accurately incident onto the light incidence surface 123 of the light guide plate 300.

The first heat dissipation plate 850 may include a metal material, for example, stainless steel and/or aluminum.

The first heat dissipation plate 850 may include light source mounting portions 777a and 778a, upper covers 777b and 778b, and lower covers 777c and 778c.

The first heat dissipation plate 850 may receive a heat that may be generated in the light source 821 or the data driving IC 147 through the light source circuit board 811, the carrier 146, and/or the printed circuit board 168, and may transmit the heat to the second heat dissipation plate 860 below the first heat dissipation plate 850.

The upper covers 777b and 778b may extend from one edge of respective ones of the light source mounting portions 777a and 778a toward the light guide plate 300 (e.g., a first, or upper outer surface thereof).

The lower covers 777c and 778c may extend from another edge of respective ones of the light source mounting portions 777a and 778a toward the light guide plate 300 (e.g., a second, or lower outer surface thereof). The lower cover 777c may take various forms other than the shapes shown in the drawings depending on the shape of the base portion 611 of the bottom case 600. For example, the lower cover 777c may extend from the light source mounting portion 777a to contact a lower surface of the reflection plate 900.

The light source 821 and the light source circuit board 811 may be in a space surrounded by the light source mounting portion 777a, the upper cover 777b, and the lower cover 777c.

The mold frame 400 may support the display panel 100 and the top case 500 while being secured to the bottom case 600, and may maintain a uniform interval between the display panel 100 and the optical sheet 201. To this end, the mold frame 400 may be formed in a quadrangular frame shape including a first support portion 411a, a second support portion 411b, and a securing portion 411c.

The first support portion 411a may support the top case 500 that may be covered thereon, when the first support portion 411a is on the plurality of side portions 612.

The second support portion 411b may extend from an inner edge of the first support portion 411a toward the optical sheet 201. A height of the second support portion 411b may be less than a height of the first support portion 411a. A space may be defined between the top case 500 and the second support portion 411b by the height difference between the second support portion 411b and the first support portion 411a, and an edge of the display panel 100 may be positioned in the space.

The securing portion 411c may extend from a lower side surface of the first support portion 411a toward the side portion 612. A coupling depression facing the locking projection 635 may be defined at an inner side surface of the securing portion 411c. The locking projection 635 may be fitted in the coupling depression, such that the mold frame 400 may be secured to the bottom case 600.

The top case 500 may have a quadrangular frame shape having an opening at a center portion thereof. The top case 500 may be located on the display panel 100. A display area A1 of the display panel 100 may be exposed through the opening of the top case 500. The top case 500 may cover an edge portion of the display panel 100, an upper surface and a side surface of the first support portion 411a of the mold frame 400, and a side surface of the securing portion 411c of the mold frame 400. To this end, the top case 500 may include a front cover 533a that covers the edge portion of the display panel 100 and the upper surface of the first support portion 411a, and a side cover 533b that covers both of the side surface of the first support portion 411a and the side surface of the securing portion 411c.

In an embodiment, a hook 525 may be at an inner side surface of the side cover 533b, and the hook 525 may contact a lower surface of the securing portion 411c provided at the mold frame 400. The top case 500 may be secured to the mold frame 400 by the hook 525. In addition, one of the side covers 533b may have an opening. The PCB 168 may be exposed outwardly of the top case 500 through the opening of the side cover 533b.

The display panel 100 may display images. The display panel 100 may include a lower panel 101 and an upper panel 102 opposing the lower panel 101.

The second heat dissipation plate 860 may be disposed so that an upper surface of the second heat dissipation plate 860 may contacts lower surfaces of the lower covers 777c and 778c of the first heat dissipation plate 850, and a lower surface of the second heat dissipation plate 860 may contact an upper surface of the bottom case 600. One end of the second heat dissipation plate 860 may contact an inner surface of the side portion 612 of the bottom case 600, and another end of the second heat dissipation plate 860 may extend by a width of each of the lower covers 777c and 778c of the first heat dissipation plate 850.

That is, the second heat dissipation plate 860 may have a substantially same length and a substantially same width as those of each of the lower covers 777c and 778c of the first heat dissipation plate 850.

The second heat dissipation plate 860 may serve to offset deformation of the backlight unit or the bottom case 600 that may be caused by the heat generated in the light source 821 or the data driving IC 147 attached to the carrier 146. That is, a deformation force may be applied to the second heat dissipation plate 860 in a direction opposite to a direction in which a deformation force is applied to the backlight unit or the bottom case 600 by using bimetallic effects, and may offset deformation of the first heat dissipation plate 850, the backlight unit, and/or the bottom case 600.

Bimetal is a combination of two types (or kinds) of metals having different thermal expansion coefficients attached to each other, and as the temperature changes, degrees of warping of the two metals are different from each other. Accordingly, for example, when the first heat dissipation plate 850 may be deformed by the heat generated from the light source, the heat generated from the light source is transmitted to the second heat dissipation plate 860, and thus a deformation forces is applied to the second heat dissipation plate 860 in a direction opposite to a direction in which the first heat dissipation plate 850 may be deformed. In such an embodiment, the deformation forces of the first heat dissipation plate 850 and the second heat dissipation plate 860 may resist or cancel out each other, and thus deformation of the first heat dissipation plate 850 and the second heat dissipation plate 860 may be substantially reduced or prevented. In addition, deformation of the backlight or the bottom case may be substantially reduced or prevented.

As used herein, a direction in which the light is emitted from the display device is defined as a first direction, and a direction opposite to the direction in which the light is emitted is defined as a second direction.

In a case where a deformation force acts in the first direction on a center portion or the center of the first heat dissipation plate 850, the backlight unit or the bottom case 600, the second heat dissipation plate 860 may have a thermal expansion coefficient higher than that of the first heat dissipation plate 850 to reduce or prevent deformation of the first heat dissipation plate 850, the backlight unit, or the bottom case 600.

For example, when the first heat dissipation plate 850 includes aluminum, the first heat dissipation plate 850 may have a thermal expansion coefficient of about 23.8 ppm, and the second heat dissipation plate 860 may be formed using a material having a thermal expansion coefficient higher than that of aluminum, for example, zinc having a thermal expansion coefficient of about 29.7 ppm, tin having a thermal expansion coefficient of about 27.0 ppm, and/or lead having a thermal expansion coefficient of about 29.3 ppm.

In a case where a deformation force acts in the second direction on a center portion or the center of the first heat dissipation plate 850, the second heat dissipation plate 860 may have a thermal expansion coefficient lower than that of the first heat dissipation plate 850 to reduce or prevent deformation of the first heat dissipation plate 850, the backlight unit, or the bottom case 600.

For example, when the first heat dissipation plate 850 includes aluminum, the first heat dissipation plate 850 may have a thermal expansion coefficient of about 23.8 ppm, and the second heat dissipation plate 860 may be formed using a material having a thermal expansion coefficient lower than that of aluminum, for example, chromium having a thermal expansion coefficient of about 6.2 ppm, iron having a thermal expansion coefficient of about 12 ppm, nickel having a thermal expansion coefficient of about 13 ppm, and/or copper having a thermal expansion coefficient of about 16.6 ppm.

A material and/or a material quality for forming the second heat dissipation plate 860 may be appropriately selected according to the thermal expansion coefficient and a deformation direction of a material and/or a material quality for forming the first heat dissipation plate 850.

The second heat dissipation plate 860 substantially reduces or prevents deformation of the first heat dissipation plate 850, the backlight unit, and/or the bottom case 600, and thus substantially reduces or prevents deformation of the display device and maintains the rigidity of the display device.

The first heat dissipation plate 850 and the second heat dissipation plate 860 may be joined with each other by a brazing scheme. Brazing is a technique of joining metal materials or nonmetal materials. It refers to a technique of heating a joint of a mother material to which a filler material is joined and melting the filler material at a temperature substantially equal to or less than a melting point, which is about 450° C. or higher, thereby joining the mother material with the filler material.

Accordingly, the filler material is positioned between the first heat dissipation plate 850 and the second heat dissipation plate 860, and only the filler material is melted and joined with the first heat dissipation plate 850 and the second heat dissipation plate 860. The filler material may include suitable materials.

Figure 3:
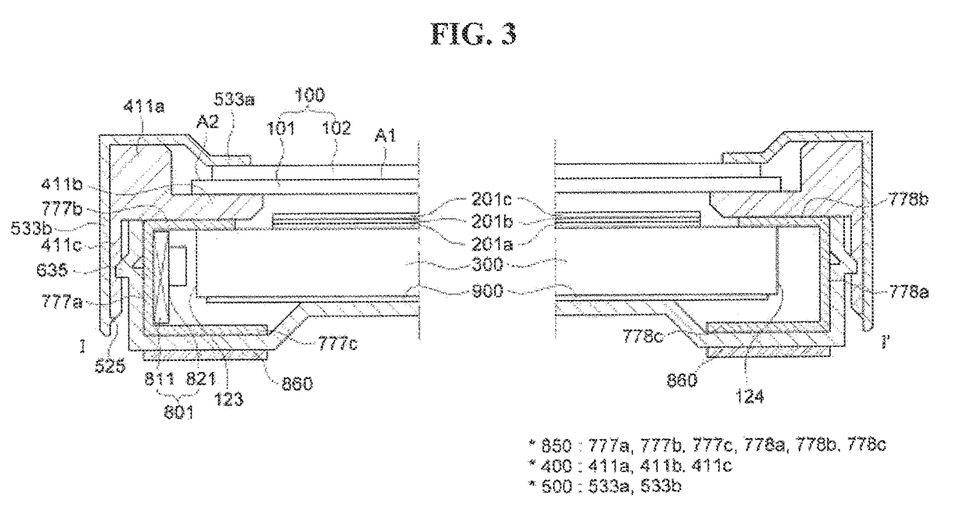
FIG. 3 is a cross-sectional view taken along line I-I' in FIG. 1 according to another embodiment.

FIG. 3 is a cross-sectional view taken along line I-I' in FIG. 1 according to another embodiment.

Referring to FIG. 3, the second heat dissipation plate 860 may be joined to a lower portion of the bottom case 600, and have a length substantially equal to a length of the first heat dissipation plate 850. The second heat dissipation plate 860 may have a width substantially equal to or greater than a width of the first heat dissipation plate 850, and may be joined with the bottom case 600 in the aforementioned brazing scheme.

When the heat generated from the light source 821 or the data driving IC 147 is transmitted to the first heat dissipation plate 850 and a deformation force acts on the first heat dissipation plate 850, the heat is also transmitted to the second heat dissipation plate 860 through the bottom case 600. In such an embodiment, a deformation force also acts on the second heat dissipation plate 860 in a direction opposite to a direction in which the deformation force acts on the first heat dissipation plate 850, thereby resisting or canceling out the deformation force applied to the first heat dissipation plate 850. Since the heat generated from the light source may deform not only the first heat dissipation plate 850 but also the bottom case 600, the deformation force acts on the second heat dissipation plate 860 in a direction opposite to a direction in which the bottom case 600 is deformed, thereby resisting or canceling out a deformation force applied to the bottom case 600.

In a case where a deformation force acts both on the first heat dissipation plate 850 and the bottom case 600, a deformation force acts on the second heat dissipation plate 860 in a direction opposite to a direction in which the deformation force acts on the first heat dissipation plate 850 and the bottom case 600, thereby resisting or canceling out the deformation force applied to the first heat dissipation plate 850 and the bottom case 600.

Figure 4:
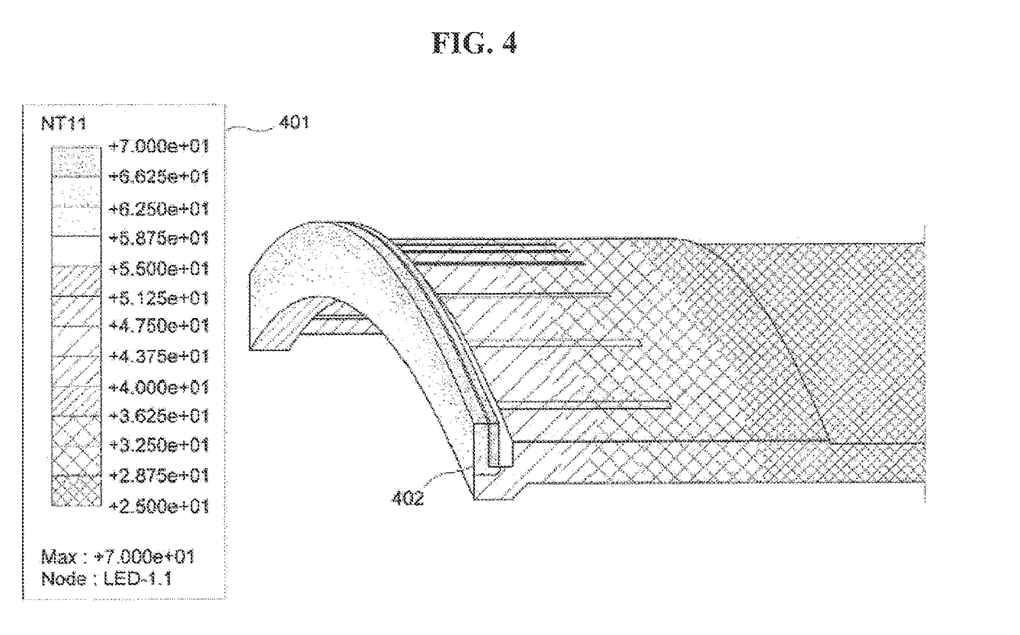
FIG. 4 is a view showing a degree of deformation of a display device according to an embodiment depending on temperature.

FIG. 4 is a view showing a temperature-dependent degree of deformation of a display device according to an embodiment.

Referring to FIG. 4, a degree of deformation of the display device due to heat is calculated through simulation.

Referring to FIGS. 2-4, a degree of deformation 401 according to a temperature is calculated through a simulation. It may be appreciated that a temperature of the first heat dissipation plate 850 is highest at a portion where the light source is disposed and a portion 402 contacting the first heat dissipation plate 850, thus showing a greatest degree of deformation, and the degree of deformation decreases as a distance from the light source increases. The first heat dissipation plate 850 expands and is deformed by the heat transmitted from the light source.

A degree of deformation and a deformation direction of the first heat dissipation plate 850 may vary depending on a structure of the first heat dissipation plate 850 and structures contacting the first heat dissipation plate 850.

The degree of deformation and the direction of thermal deformation of the first heat dissipation plate 850, the backlight unit or the bottom case 600 may be identified through simulation. When the degree of deformation and the direction of thermal deformation are identified, a thermal expansion coefficient of the second heat dissipation plate 860 is determined in consideration of the direction of thermal deformation. A material of the second heat dissipation plate 860 may be selected in consideration of the thermal expansion coefficient, and a thickness and a width of the second heat dissipation plate 860 may be determined in consideration of the degree of deformation.

In a case where a center portion or the center of the first heat dissipation plate 850 may deform in the first direction, a deformation force may act on the second heat dissipation plate 860 in a direction opposite to the first direction to suppress potential warping of the first heat dissipation plate 850, which means a degree of expansion of the second heat dissipation plate 860 needs to be greater than a degree of expansion of the first heat dissipation plate 850. Accordingly, the second heat dissipation plate 860 may have a thermal expansion coefficient higher than that of the first heat dissipation plate 850.

For example, when the first heat dissipation plate 850 includes aluminum, the first heat dissipation plate 850 may have a thermal expansion coefficient of about 23.8 ppm, and the second heat dissipation plate 860 may be formed using a material having a thermal expansion coefficient higher than that of aluminum, for example, zinc having a thermal expansion coefficient of about 29.7 ppm, tin having a thermal expansion coefficient of about 27.0 ppm, and/or lead having a thermal expansion coefficient of about 29.3 ppm.

In a case where the center portion or the center of the first heat dissipation plate 850, the backlight unit, or the bottom case 600 may deform and warp in the second direction, a force may be applied to the first heat dissipation plate 850 in a direction opposite to a direction in which they may warp. Accordingly, the second heat dissipation plate 860 may have a thermal expansion coefficient lower than that of the first heat dissipation plate 850.

For example, when the first heat dissipation plate 850 includes aluminum, the first heat dissipation plate 850 may have a thermal expansion coefficient of about 23.8 ppm, and the second heat dissipation plate 860 may be formed using a material having a thermal expansion coefficient lower than that of aluminum, for example, chromium having a thermal expansion coefficient of about 6.2 ppm, iron having a thermal expansion coefficient of about 12 ppm, nickel having a thermal expansion coefficient of about 13 ppm, and/or copper having a thermal expansion coefficient of about 16.6 ppm.

The thermal expansion coefficient of the second heat dissipation plate 860 may be determined in consideration of the thickness of the first heat dissipation plate 850, and the thermal expansion coefficient and the degree of thermal deformation of the first heat dissipation plate 850 that may vary according to the thickness thereof.

The method of substantially reducing or preventing deformation of the display device depending on the temperature according to an embodiment is also applicable to a curved display device. The curved display device is processed by giving a certain curvature to the display device in order to enhance the immersion feeling of the viewer.

If a high-temperature heat is generated in the light source of the curved display device, the curvature of the curved display device may not be maintained as desired. The display device having an undesirable curvature may hinder the immersion feeling of the viewer.

Accordingly, in order to reduce or prevent the curvature of the curved display device from being undesirably altered due to the high-temperature heat, the second heat dissipation plate 860 may be joined so that a deformation force acts in a direction opposite to a direction in which a deformation force acts on the first heat dissipation plate 850 or the bottom case 600, and thus the curvature of the curved display device may be better maintained or the curvature may have a reduced chance of or be prevented from being undesirably altered.

That is, the second heat dissipation plate 860 that has a thermal expansion coefficient higher than the thermal expansion coefficient of the first heat dissipation plate 850 is below the first heat dissipation plate 850 to allow the second heat dissipation plate 860 to expand, such that the curvature of the curved display device may be better maintained or the curvature may have a reduced chance of or be prevented from being undesirably altered.

For example, when the first heat dissipation plate 850 includes aluminum, the first heat dissipation plate 850 may have a thermal expansion coefficient of about 23.8 ppm, and the second heat dissipation plate 860 may be formed using a material having a thermal expansion coefficient higher than that of aluminum, for example, zinc having a thermal expansion coefficient of about 29.7 ppm, tin having a thermal expansion coefficient of about 27.0 ppm, and/or lead having a thermal expansion coefficient of about 29.3 ppm.

Figure 5:
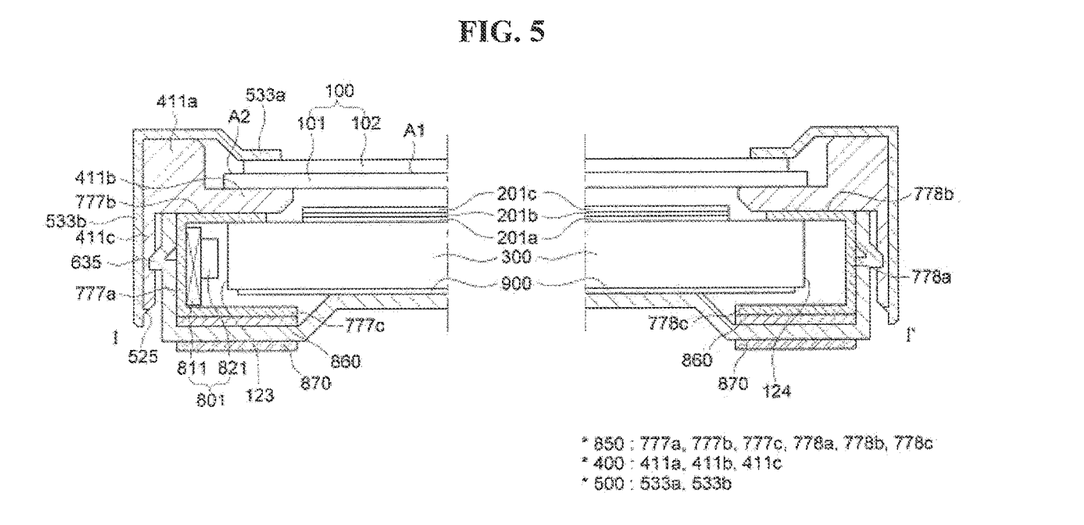
FIG. 5 is a cross-sectional view taken along line I-I' in FIG. 1 according to another embodiment.

FIG. 5 is a cross-sectional view taken along line I-I' in FIG. 1 according to another embodiment. Description of the same components as those described above will be omitted.

Referring to FIG. 5, the second heat dissipation plate 860 may beunder the first heat dissipation plate 850, and a third heat dissipation plate 870 may be under the bottom case 600.

The second heat dissipation plate 860 may be under the first heat dissipation plate 850, and may be deformed in a direction opposite to a direction in which the first heat dissipation plate 850 may be deformed, and thus substantially prevents (e.g., reduces the chance of) the first heat dissipation plate 850 from being deformed.

The third heat dissipation plate 870 reinforces the second heat dissipation plate 860 to prevent (e.g., reduces the chance of) deformation of the first heat dissipation plate 850 and the bottom case 600. That is, when the second heat dissipation plate 860 may not completely suppress the deformation of the first heat dissipation plate 850, the third heat dissipation plate 870 may be under the bottom case 600 so that a deformation force acts in a direction opposite to a direction in which the first heat dissipation plate 850, the second heat dissipation plate 860, and the bottom case 600 may be deformed. Accordingly, deformation of the first heat dissipation plate 850, the second heat dissipation plate 860, and the bottom case 600 may be resisted or cancelled out.

That is, in a case where a deformation force acts on the first heat dissipation plate 850, the second heat dissipation plate 860, and the bottom case 600 in the first direction, the third heat dissipation plate 870 may have a thermal expansion coefficient higher than those of the first heat dissipation plate 850, the second heat dissipation plate 860, and the bottom case 600, and suppress deformation of the first heat dissipation plate 850, the second heat dissipation plate 860, and the bottom case 600. Alternatively, in a case where a deformation force acts on the first heat dissipation plate 850, the second heat dissipation plate 860, and the bottom case 600 in the second direction, the third heat dissipation plate 870 may have a thermal expansion coefficient lower than those of the first heat dissipation plate 850, the second heat dissipation plate 860, and the bottom case 600, and suppress deformation of the first heat dissipation plate 850, the second heat dissipation plate 860, and the bottom case 600.

A material, a material quality, and/or a thermal expansion coefficient for forming the third heat dissipation plate 870 may be determined based on the simulation result of the first heat dissipation plate 850 and the second heat dissipation plate 860 being joined with each other.

Figure 6:
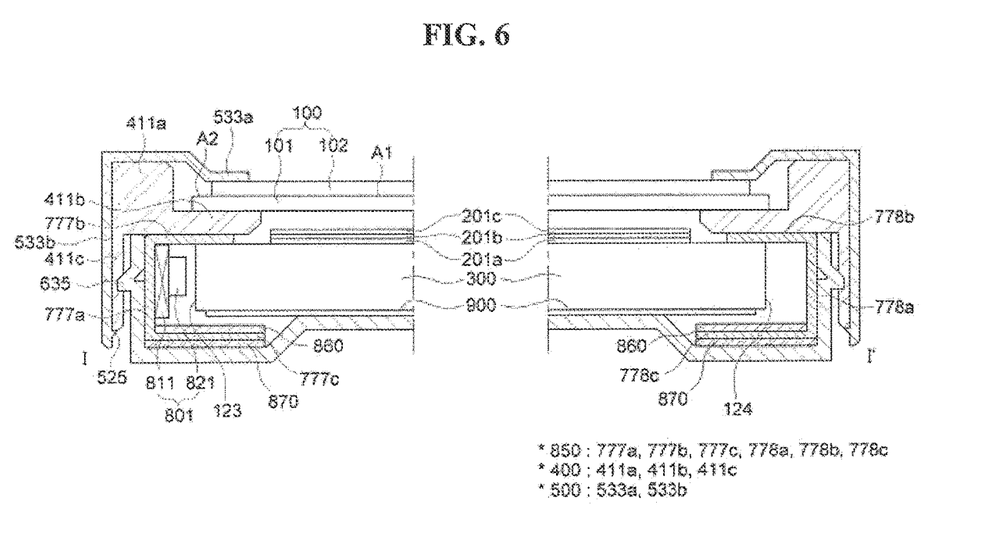
FIG. 6 is a cross-sectional view taken along line I-I' in FIG. 1 according to another embodiment.

FIG. 6 is a cross-sectional view taken along line I-I' in FIG. 1 according to another embodiment. Description of the same components as those described above will be omitted.

Referring to FIG. 6, the second heat dissipation plate 860 is disposed on the first heat dissipation plate 850, and the third heat dissipation plate 870 is disposed under the first heat dissipation plate 850 and between the first heat dissipation plate 850 and the bottom case 600.

The second heat dissipation plate 860 and the third heat dissipation plate 870 may be deformed in directions opposite from each other and may, thus, offset deformation of the first heat dissipation plate 850.

That is, in a case where a deformation force acts on the first heat dissipation plate 850 in the first direction, a deformation force acts on the second heat dissipation plate 860 that has a thermal expansion coefficient lower than that of the first heat dissipation plate 850 in a direction opposite to a direction in which the deformation force acts on the first heat dissipation plate 850, thereby resisting or canceling out the deformation of the first heat dissipation plate 850. In addition, the third heat dissipation plate 870 that has a thermal expansion coefficient higher than that of the first heat dissipation plate 850 also resists or cancels out the deformation force of the first heat dissipation plate 850.

For example, when the first heat dissipation plate 850 includes aluminum, the first heat dissipation plate 850 may have a thermal expansion coefficient of about 23.8 ppm; the second heat dissipation plate 860 may be formed using a material having a thermal expansion coefficient lower than that of aluminum, for example, chromium having a thermal expansion coefficient of about 6.2 ppm, iron having a thermal expansion coefficient of about 12 ppm, nickel having a thermal expansion coefficient of about 13 ppm, and/or copper having a thermal expansion coefficient of about 16.6 ppm; and the third heat dissipation plate 870 may be formed using a material having a thermal expansion coefficient higher than that of aluminum, for example, zinc having a thermal expansion coefficient of about 29.7 ppm, tin having a thermal expansion coefficient of about 27.0 ppm, and/or lead having a thermal expansion coefficient of about 29.3 ppm.

Alternatively, in a case where a deformation force acts on the first heat dissipation plate 850 in the second direction, the second heat dissipation plate 860 that has a thermal expansion coefficient higher than that of the first heat dissipation plate 850 resists or cancels out the deformation force of the first heat dissipation plate 850, and the third heat dissipation plate 870 that has a thermal expansion coefficient lower than that of the first heat dissipation plate 850 resists or cancels out the deformation force of the first heat dissipation plate 850.

For example, when the first heat dissipation plate 850 includes aluminum, the first heat dissipation plate 850 may have a thermal expansion coefficient of about 23.8 ppm; the second heat dissipation plate 860 may be formed using a material having a thermal expansion coefficient higher than that of aluminum, for example, zinc having a thermal expansion coefficient of about 29.7 ppm, tin having a thermal expansion coefficient of about 27.0 ppm, and/or lead having a thermal expansion coefficient of about 29.3 ppm; and the third heat dissipation plate 870 may be formed using a material having a thermal expansion coefficient lower than that of aluminum, for example, chromium having a thermal expansion coefficient of about 6.2 ppm, iron having a thermal expansion coefficient of about 12 ppm, nickel having a thermal expansion coefficient of about 13 ppm, and/or copper having a thermal expansion coefficient of about 16.6 ppm.

Figure 7:
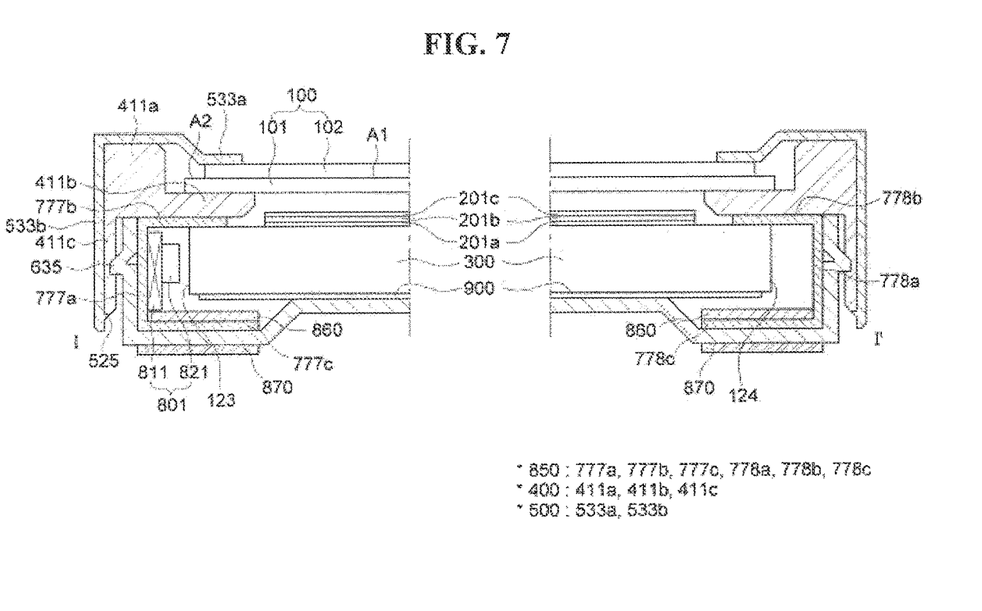
FIG. 7 is a cross-sectional view taken along line I-I' in FIG. 1 according to another embodiment.

FIG. 7 is a cross-sectional view taken along line I-I' in FIG. 1 according to another embodiment. Description of the same components as those described above will be omitted.

Referring to FIG. 7, the second heat dissipation plate 860 may be on the first heat dissipation plate 850, and the third heat dissipation plate 870 may be under the bottom case 600.

The second heat dissipation plate 860 may have a thermal expansion coefficient capable of resisting or canceling out deformation of the first heat dissipation plate 850. That is, in a case where the first heat dissipation plate 850 receives a deformation force in the first direction, the second heat dissipation plate 860 may have a thermal expansion coefficient lower than that of the first heat dissipation plate 850, and in a case where the first heat dissipation plate 850 receives a deformation force in the second direction, the second heat dissipation plate 860 may have a thermal expansion coefficient higher than that of the first heat dissipation plate 850, thereby resisting or canceling out the deformation of the first heat dissipation plate 850.

The third heat dissipation plate 870 may be under the bottom case 600, may reinforce the second heat dissipation plate 860, and may receive a deformation force in a direction for resisting or canceling out deformation of the first heat dissipation plate 850, the second heat dissipation plate 860, and the bottom case 600.

When the second heat dissipation plate 860 does not completely suppress the deformation of the first heat dissipation plate 850, the third heat dissipation plate 870 may be disposed under the bottom case 600 so that a deformation force acts on the third heat dissipation plate 870 in a direction opposite to a direction in which a deformation force acts on the first heat dissipation plate 850, the second heat dissipation plate 860, and the bottom case 600. Accordingly, deformation of the first heat dissipation plate 850, the second heat dissipation plate 860, and the bottom case 600 may be resisted or cancelled out.

That is, in a case where the first heat dissipation plate 850, the second heat dissipation plate 860, and the bottom case 600 may be deformed in the first direction, the third heat dissipation plate 870 may have a thermal expansion coefficient higher than those of the first heat dissipation plate 850, the second heat dissipation plate 860, and the bottom case 600, thereby suppressing deformation of the first heat dissipation plate 850, the second heat dissipation plate 860, and the bottom case 600. Alternatively, in a case where the first heat dissipation plate 850, the second heat dissipation plate 860, and the bottom case 600 may be deformed in the second direction, the third heat dissipation plate 870 may have a thermal expansion coefficient lower than those of the first heat dissipation plate 850, the second heat dissipation plate 860, and the bottom case 600, thereby suppressing deformation of the first heat dissipation plate 850, the second heat dissipation plate 860, and the bottom case 600.

As set forth hereinabove, a display device according to one or more embodiments is capable of substantially reducing or preventing warping or deformation thereof by using a bimetallic effect.

In addition, a display device according to one or more embodiments is capable of substantially maintaining a curvature of a curved display.

While the present invention has been illustrated and described with reference to the embodiments thereof, it will be apparent to those of ordinary skill in the art that various changes in form and detail may be made thereto without departing from the spirit and scope of the present invention. Accordingly, the true scope of the present invention should be determined by the technical idea of the appended claims and equivalents thereof.

What is claimed is:

1. A display module comprising:
a circuit board;
a first heat dissipation plate configured to discharge heat from the circuit board;
a bottom case configured to accommodate the circuit board and the first heat dissipation plate; and
a second heat dissipation plate joined to the first heat dissipation plate or the bottom case by brazing,
wherein the second heat dissipation plate is configured to resist a deformation force that is applied to the first heat dissipation plate or the bottom case,
wherein the second heat dissipation plate has a thermal expansion coefficient different from a thermal expansion coefficient of the first heat dissipation plate, and
wherein the thermal expansion coefficient of the second heat dissipation plate is based on a deformation direction of the first heat dissipation plate or the bottom case.

2. The display module of claim 1, wherein the first heat dissipation plate includes at least one selected from aluminum, aluminum alloy, and stainless steel.

3. The display module of claim 2, wherein the second heat dissipation plate includes at least one selected from zinc, tin and lead.

4. The display module of claim 2, wherein the second heat dissipation plate includes at least one selected from chromium, iron, nickel, and copper.

5. The display module of claim 1, wherein the second heat dissipation plate is under the first heat dissipation plate.

6. The display module of claim 5, wherein the thermal expansion coefficient of the second heat dissipation plate is higher than the thermal expansion coefficient of the first heat dissipation plate.

7. The display module of claim 5, wherein the thermal expansion coefficient of the second heat dissipation plate is lower than the thermal expansion coefficient of the first heat dissipation plate.

8. The display module of claim 1, wherein the second heat dissipation plate is over the first heat dissipation plate.

9. The display module of claim 8, further comprising a third heat dissipation plate under the first heat dissipation plate.

10. The display module of claim 8, wherein the thermal expansion coefficient of the second heat dissipation plate is lower than the thermal expansion coefficient of the first heat dissipation plate.

11. The display module of claim 8, wherein the thermal expansion coefficient of the second heat dissipation plate is higher than the thermal expansion coefficient of the first heat dissipation plate.

12. A display device comprising:
a display panel configured to display images;
a circuit board;
a first heat dissipation plate configured to discharge heat from the circuit board;
a bottom case configured to accommodate the circuit board and the first heat dissipation plate; and
a second heat dissipation plate joined to the first heat dissipation plate or the bottom case by brazing,
wherein the second heat dissipation plate is configured to resist a deformation force that is applied to the first heat dissipation plate or the bottom case,
wherein the second heat dissipation plate has a thermal expansion coefficient different from a thermal expansion coefficient of the first heat dissipation plate, and
wherein the thermal expansion coefficient of the second heat dissipation plate is based on a deformation direction of the first heat dissipation plate or the bottom case.

13. The display device of claim 12, wherein the first heat dissipation plate includes at least one selected from aluminum, aluminum alloy, and stainless steel.

14. The display device of claim 13, wherein the second heat dissipation plate includes at least one selected from zinc, tin and lead.

15. The display device of claim 13, wherein the second heat dissipation plate includes at least one selected from chromium, iron, nickel, and copper.

16. The display device of claim 12, wherein the first heat dissipation plate is between the display panel and the second heat dissipation plate.

17. The display device of claim 16, wherein the thermal expansion coefficient of the second heat dissipation plate is higher than the thermal expansion coefficient of the first heat dissipation plate.

18. The display device of claim 16, wherein the thermal expansion coefficient of the second heat dissipation plate is lower than the thermal expansion coefficient of the first heat dissipation plate.

19. The display device of claim 12, wherein the second heat dissipation plate is between the display panel and the first heat dissipation plate.

20. The display device of claim 19, further comprising a third heat dissipation plate under the first heat dissipation plate.

21. The display device of claim 19, wherein the thermal expansion coefficient of the second heat dissipation plate is lower than the thermal expansion coefficient of the first heat dissipation plate.

22. The display device of claim 19, wherein the thermal expansion coefficient of the second heat dissipation plate is higher than the thermal expansion coefficient of the first heat dissipation plate.

23. The display device of claim 12, wherein the display panel has a curved surface.

24. The display device of claim 23, wherein the thermal expansion coefficient of the second heat dissipation plate is higher than the thermal expansion coefficient of the first heat dissipation plate.

* * * * *